US008540440B2

(12) United States Patent
Kishinami et al.

(10) Patent No.: US 8,540,440 B2
(45) Date of Patent: Sep. 24, 2013

(54) IMAGE CAPTURE LENS, WAFER LENS, WAFER LENS LAMINATE, METHOD OF MANUFACTURING IMAGE CAPTURE LENS, IMAGE CAPTURE LENS INTERMEDIATE PRODUCT, METHOD OF MANUFACTURING IMAGE CAPTURE LENS INTERMEDIATE PRODUCT

(75) Inventors: Katsuya Kishinami, Hachioji (JP); Haruhiko Masutomi, Machida (JP)

(73) Assignee: Konica Minolta Opto, Inc., Tokyo (JP)

( * ) Notice: Subject to any disclaimer, the term of this patent is extended or adjusted under 35 U.S.C. 154(b) by 0 days.

(21) Appl. No.: 13/499,647

(22) PCT Filed: Apr. 22, 2011

(86) PCT No.: PCT/JP2011/059913
§ 371 (c)(1),
(2), (4) Date: Mar. 30, 2012

(87) PCT Pub. No.: WO2011/136138
PCT Pub. Date: Nov. 3, 2011

(65) Prior Publication Data
US 2012/0183288 A1    Jul. 19, 2012

(30) Foreign Application Priority Data
Apr. 27, 2010   (JP) ................................ 2010-102094

(51) Int. Cl.
G03B 9/02   (2006.01)
(52) U.S. Cl.
USPC ........................................................ 396/505
(58) Field of Classification Search
USPC ........................................................ 396/505
See application file for complete search history.

(56) References Cited

U.S. PATENT DOCUMENTS

| 2006/0018029 | A1* | 1/2006 | Vigier-Blanc | 359/642 |
|---|---|---|---|---|
| 2006/0215269 | A1* | 9/2006 | Abe et al. | 359/619 |
| 2007/0221826 | A1 | 9/2007 | Bechtel et al. | |
| 2007/0275505 | A1* | 11/2007 | Wolterink et al. | 438/118 |
| 2010/0118182 | A1* | 5/2010 | Fujii et al. | 348/374 |
| 2010/0208354 | A1 | 8/2010 | Okazaki | |
| 2010/0328743 | A1* | 12/2010 | Wolterink et al. | 359/19 |

FOREIGN PATENT DOCUMENTS

| EP | 1 070 972 | 1/2001 |
|---|---|---|
| EP | 1 239 519 | 9/2002 |
| JP | 2000-241604 | 9/2000 |
| JP | 2000-266909 | 9/2000 |
| WO | WO 2009/048320 | 4/2009 |
| WO | WO 2009/133756 | 11/2009 |

OTHER PUBLICATIONS

Written Opinion issued on May 31, 2011 in the corresponding PCT Application, PCT/JP2011/059913.
Search Report dated Jul. 23, 2013 issued in the corresponding European Patent Application No. 11 77 4920.0.

* cited by examiner

Primary Examiner — Rodney Fuller
(74) Attorney, Agent, or Firm — Cozen O'Connor

(57) ABSTRACT

An image capture lens is equipped with: a diaphragm which is formed on a substrate, adjusts a light quantity, and has a predetermined aperture; an inorganic or organic adhesion layer formed on the substrate such that the diaphragm is exposed; and a resin part which has a lens part made from a curable resin. The resin part is directly joined to the inorganic or organic adhesion layer and diaphragm. The surface of the substrate on which the diaphragm is formed is subjected to a modification treatment so that a water contact angle is within a range of 3° to 30°.

34 Claims, 3 Drawing Sheets

IMAGE CAPTURE LENS, WAFER LENS, WAFER LENS LAMINATE, METHOD OF MANUFACTURING IMAGE CAPTURE LENS, IMAGE CAPTURE LENS INTERMEDIATE PRODUCT, METHOD OF MANUFACTURING IMAGE CAPTURE LENS INTERMEDIATE PRODUCT

This is a U.S. National Phase Application under 35 USC 371 of International Application PCT/JP2011/059913 filed on Apr. 22, 2011.

This application claims the priority of Japanese Application No. 2010-102094 filed Apr. 27, 2010, the entire content of which is hereby incorporated by reference.

TECHNICAL FIELD

The present invention relates to an image capture lens, a wafer lens, a wafer lens laminate, a method of manufacturing an image capture lens, an image capture lens intermediate product, and a method of manufacturing an image capture lens intermediate product lens.

BACKGROUND ART

In the field of manufacturing of optical lenses, there has been discussed techniques for obtaining highly heat-resistant optical lenses, by providing lens portions (optical parts) composed of a curable resin such as thermosetting resin, on a flat glass plate.

An exemplary method of manufacturing an optical lens ever developed is such as forming a diaphragm for adjusting quantity of incident light, which diaphragm is composed of a metal film formed on a substrate, and providing on the surface of the diaphragm a plurality of optical components composed of a curable resin, to thereby form a so-called "wafer lens". A plurality of wafer lenses, respectively formed monolithically, are then stacked and bonded, while placing spacers in between or while bringing projections formed concurrently with the optical surface into contact, to thereby form a plurality of compound lenses, and the substrate is then diced so as to singulate the lens portions. This method of manufacturing successfully reduces manufacturing costs of optical lenses.

On the other hand, the dicing of the wafer lens for singulating the lens portions raises a technical problem specific to the wafer lens. Due to large internal stress of the lens portions, the lens portions may occasionally separate from the substrate. Especially for the case where the diaphragms are formed integrally with the substrate, an additional problem arises in that the separation may be induced by dicing, also between the lens portions and the substrate having the diaphragms formed thereon, between the substrate and the diaphragms, and at other various interfaces. In short, a subject of achieving adhesive force among the substrate, the diaphragms, and the individual layers composing the lens portions durable to the dicing still remains to be solved, in view of obtaining desirable optical systems.

As one of techniques of improving the adhesive force among the layers formed in the optical components, Patent Document 1 discloses a technique of providing a layer which contains silane coupling agent, between an anti-reflection film for suppressing reflection on the surface of the optical components, and a substrate which serves as a base, to thereby enhance adhesiveness of the anti-reflection film to the base.

Another known technique relates to a method of manufacturing a micro-lens array, in which an adhesiveness enhancing layer is provided between a die base and a photo-sensitive material (see Patent Document 2, for example).

PRIOR ART DOCUMENTS

Patent Documents

Patent Document 1: Japanese Laid Open Patent Publication No. 2000-241604

Patent Document 2: Japanese Laid Open Patent Publication No. 2000-266909

SUMMARY OF THE INVENTION

Problems to be Solved by the Invention

Since the diaphragms and the lens portions may occasionally separate respectively from the substrate and the diaphragms, in the process of dicing for singulating the lens portions due to large internal stress of the lens portions, so that there is a persisting subject of improving the adhesive force among the individual layers. However, the above-described Patent Documents 1 and 2 do not deal with the wafer lens, and do not discuss the problem of separation in the process of dicing. In particular, there is even no disclosure or suggestion on that the dicing may induce the separation among the substrate, the diaphragms and the lens portions and may adversely affect optical characteristics, in the case of forming diaphragms and lens portions on substrates in a laminated manner.

While there is a description on improvement of the adhesive force with the aid of the layer containing the silane coupling agent or the like, types and reaction mechanism of the silane coupling are not mentioned, and also improvement in wettability among the individual layers is not described.

The present invention was conceived after considering the above-described situation, and an object of which is to provide an image capture lens, a wafer lens, a wafer lens laminate, a method of manufacturing an image capture lens, an image capture lens intermediate product, and a method of manufacturing an image capture lens intermediate product, capable of preventing separation of the diaphragms from the substrate, or the lens portions from the substrate having the diaphragms formed thereon, and of improving the adhesiveness among the individual layers, on the premise that the wafer lenses are singulated into a single lens portion by dicing.

Means of Solving the Problems

According to one embodiment of the present invention, there is provided an image capture lens, comprising:

a diaphragm formed on a substrate and having a predetermined aperture for adjusting quantity of light;

an inorganic or organic adhesive layer formed on the substrate so as to cover the diaphragm; and a resin component having a lens portion made of a curable resin, wherein the resin component is bonded directly to the inorganic or organic adhesive layer.

According to another embodiment of the present invention, there is provided an image capture lens, comprising;

a diaphragm formed on a substrate and having a predetermined aperture for adjusting quantity of light;

an inorganic or organic adhesive layer formed on the substrate so as to expose the diaphragm; and a resin component having a lens portion made of a curable resin, wherein the resin component is bonded directly to the inorganic or organic adhesive layer, and to the diaphragm.

According to another embodiment of the present invention, there is provided a wafer lens, comprising:

a plurality of diaphragms formed on a substrate, each having a predetermined aperture for adjusting quantity of light;

an inorganic or organic adhesive layer formed on the substrate so as to cover the diaphragms; and a resin component having a plurality of lens portions made of a curable resin, wherein the resin component is bonded directly to the inorganic or organic adhesive layer.

According to another embodiment of the present invention, there is provided a wafer lens, comprising;

a plurality of diaphragms formed on a substrate, each having a predetermined aperture for adjusting quantity of light;

an inorganic or organic adhesive layer formed on the substrate so as to expose the diaphragms; and a resin component having a plurality of lens portions made of a curable resin, wherein the resin component is bonded directly to the inorganic or organic adhesive layer, and to the diaphragms.

According to another embodiment of the present invention, there is provided a wafer lens, comprising:

a plurality of diaphragms formed on a substrate, each having a predetermined aperture for adjusting quantity of light;

an inorganic or organic adhesive layer formed on the substrate so as to expose the diaphragms; and a resin component having a plurality of lens portions made of a curable resin, wherein the resin component is bonded directly to the inorganic or organic adhesive layer, and to the diaphragms, and a spacer having opening at positions corresponded to the plurality of lenses in the direction of optical axis thereof, is bonded to positions in a direction of optical axis corresponding to the plurality of lens portions.

According to another embodiment of the present invention, there is provided a wafer lens laminate configured by stacking a plurality of wafer lenses, wherein at least one wafer lens out of the plurality of wafer lenses comprises:

a plurality of diaphragms formed on a substrate, each having a predetermined aperture for adjusting quantity of light;

an inorganic or organic adhesive layer formed on the substrate so as to expose the diaphragms; and a resin component having a plurality of lens portions made of a curable resin, the resin component being bonded directly to the inorganic or organic adhesive layer, and to the diaphragms.

According to another embodiment of the present invention, there is provided a method of manufacturing an image capture lens which has a resin component including a lens portion made of a curable resin, which resin component being formed on a substrate, the method comprising:

a diaphragm forming process for forming on the substrate, each of a plurality of diaphragms having a predetermined aperture for adjusting quantity of light;

an adhesive layer forming process following after the diaphragm forming process, for forming on the substrate having the diaphragms formed thereon, an inorganic or organic adhesive layer so as to cover the diaphragms;

a molding process following after the adhesive layer forming process, for forming the resin component by dropping the curable resin between the inorganic or organic adhesive layer and a molding die having a molding surface for forming a plurality of the lens portions, and by molding and curing the resin under pressurized die; and a dicing process following after the molding process, for dicing a work to singulate the plurality of the lens portions into a single lens portion.

According to another embodiment of the present invention, there is provided a method of manufacturing an image capture lens having a resin component which has a lens portion made of a curable resin, which resin component being formed on a substrate, the method comprising:

a diaphragm forming process for forming on the substrate, each a plurality of diaphragms having a predetermined aperture for adjusting quantity of light;

an adhesive layer forming process following after the diaphragm forming process, for forming on the substrate having the diaphragms formed thereon, an inorganic or organic adhesive layer so as to cover the diaphragms;

an adhesive layer removing process following after the adhesive layer forming process, for removing portions of the inorganic or organic adhesive layer formed on the diaphragms;

a molding process following after the adhesive layer removing process, for forming the resin component by dropping the curable resin between the inorganic or organic adhesive layer and a molding die having a molding surface for forming a plurality of the lens portions, and by molding and curing the resin under pressurized die; and a dicing process following after the molding process, for dicing a work to thereby singulate the plurality of the lens portions into a single lens portion.

According to another embodiment of the present invention, there is provided a method of manufacturing an image capture lens having a resin component which has a lens portion made of a curable resin and which resin component being formed on at least one surface of a substrate, the method comprising:

a diaphragm forming process for forming on at least one surface of the substrate, a plurality of diaphragms each having a predetermined aperture for adjusting quantity of light;

an adhesive layer forming process following after the diaphragm forming process, for forming on the substrate having the diaphragms formed thereon, an inorganic or organic adhesive layer so as to cover the diaphragms;

an adhesive layer removing process following after the adhesive layer forming process, for removing portions of the inorganic or organic adhesive layer formed on the diaphragms;

a molding process following after the adhesive layer removing process, for forming the resin component by dropping the curable resin between the inorganic or organic adhesive layer and a molding die having a molding surface for forming a plurality of the lens portions, and by molding and curing the resin under pressurized die;

a stacking process for forming a wafer lens laminate by stacking a plurality of the wafer lenses obtained by the molding process; and a dicing process following after the stacking process, for dicing a work to singulate the plurality of the lens portions into a single lens portion.

According to another embodiment of the present invention, there is provided an image capture lens intermediate product for fabricating an image capture lens, which has a resin component having a lens portion made of a curable resin, on a substrate, the intermediate product comprising a diaphragm formed on a substrate and having a predetermined aperture for adjusting quantity of light, wherein water contact angle on a surface of the diaphragm is in a range from 3° or larger and 30° or smaller.

According to another embodiment of the present invention, there is provided a method of manufacturing an image capture lens intermediate product for fabricating an image capture lens, which has a resin component having a lens portion made of a curable resin, on a substrate, the method comprising:

a diaphragm forming process for forming on at least one surface of the substrate, a diaphragm having a predetermined aperture for adjusting quantity of light; and a surface modification process for performing surface modification treatment with respect to at least one surface of the substrate having the diaphragm formed thereon.

Effects of the Invention

According to the present invention, optical components such as the diaphragms and the lens portions are prevented from separating from the individual interfaces, and thereby the adhesiveness among the individual layers may be improved.

In addition, the wettability may be improved by subjecting the surfaces of the substrate and diaphragms to surface modification treatment, so that the adhesiveness among the individual layers is improved also in this aspect. Since the adhesiveness among the individual layers is improved, so that MTF characteristics or the like of the singulated lens obtained after dicing of the wafer lens, may be desirable.

DESCRIPTION OF THE PREFERRED EMBODIMENTS

Preferred embodiments of the present invention will be explained below, referring to the attached drawings.
[Image Capture Device]

Figure 1:
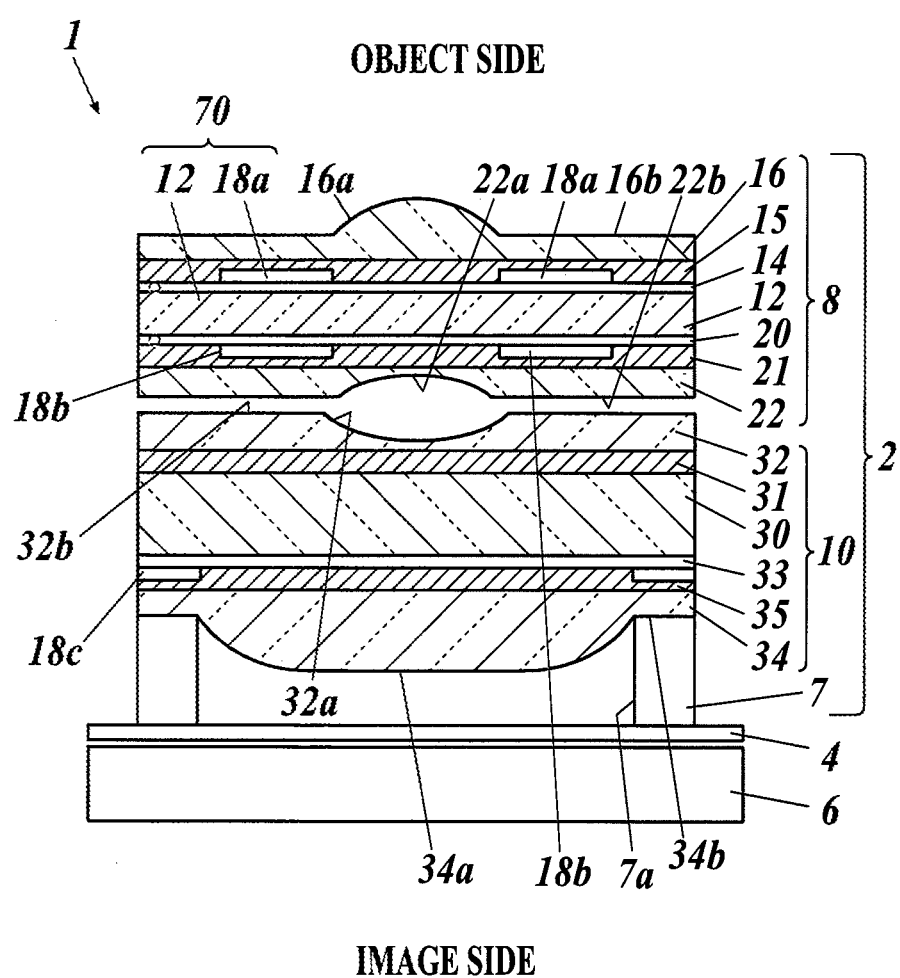
[FIG. 1] This is a sectional view illustrating an overall configuration of an image capture device and an image capture lens used therefore.

As illustrated in FIG. 1, an image capture device 1 is configured by an image capture lens unit 2, a cover glass 4, and a sensor unit which is composed of a package 6 which houses an image capture element (not illustrated). The sensor unit is disposed below the image capture lens unit 2. A CMOS-type image sensor may typically be used as the unillustrated image capture element.

The image capture lens unit 2 is configured by two lens groups 8, 10, and a spacer 7.

First, the lens group 8 will be explained.

The lens group 8 has a substrate 12.

The substrate 12 may be good enough if it is transparent, and has sufficient levels of heat resistance and strength. A base mainly composed of low-alkali borosilicate glass or transparent inorganic oxide, and a base mainly composed of a heat-resistant transparent resin such as polyimide or epoxy resin, may be exemplified.

On the top surface of the substrate 12, an adhesive layer 14 is formed. On the top surface of the adhesive layer 14, a diaphragm 18a and an adhesive layer 15 which covers the diaphragm 18a are formed. On the entire top surface of the adhesive layer 15, a resin component 16 is formed.

The adhesive layer 14 is provided between the substrate 12 and the diaphragm 18a, and can enhance the adhesive force of the substrate 12 exerted on the diaphragm 18a. The adhesive layer 14 is omissible.

The adhesive layer 15 is provided between a set of the substrate 12 and the diaphragm 18a, and the resin component 16, and can enhance the adhesive force of the substrate 12 and the diaphragm 18a, exerted on the resin component 16.

The adhesive layer 14 is an organic adhesive layer, and the adhesive layer 15 is an inorganic or organic adhesive layer.

The inorganic adhesive layer may typically be an inorganic oxide layer composed of titanium dioxide, alumina, silicon dioxide or the like.

The organic adhesive layer may be composed of any of generally known adhesives, or may be a layer composed of acryl-based, isocyanate-based, epoxy-based, and amino-based silane coupling agent layer.

While whichever the organic adhesive layer or the inorganic adhesive layer is adoptable to the adhesive layer 15, it is more preferable to adopt the organic adhesive layer. For the case where the silane coupling agent layer is adopted to the adhesive layer 15, the adhesive layer 15 is preferably configured to have a double-layered structure in which the lower layer thereof is configured by an inorganic adhesive layer and the upper layer thereof by an organic adhesive layer.

The diaphragm 18a may be composed of a UV- or heat-curable negative resist or positive resist mixed with a black filler, or may be composed mainly of chromium oxide.

The diaphragm 18a may be formed typically by forming a film on the entire surface of the substrate 12 by vapor phase deposition process or coating process, and by patterning the film into an annular pattern so as to surround the resin component 16 (convex lens portion 16a) in the plan view.

Figure 3:
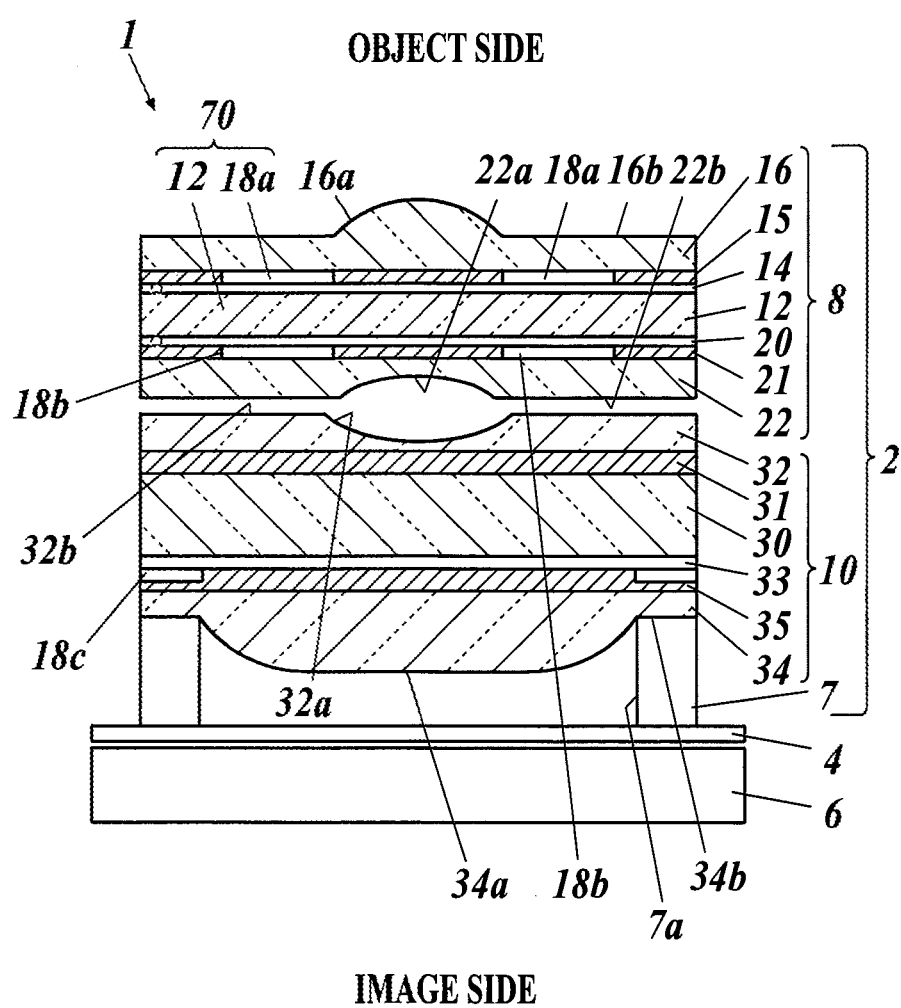
[FIG. 3] This is a drawing illustrating a modified example of FIG. 1.

The adhesive layer 15 between the diaphragm 18a and the resin component 16 in the present invention may be provided, as illustrated in FIG. 1, on the substrate 12 having the diaphragm 18a formed thereon, so as to cover the entire surface of the diaphragm 18a, wherein the resin component having the lens portions is bonded directly to the adhesive layer (form (i)); or, as illustrated in FIG. 3, only on the areas where the top surface of the substrate 12 expose without being covered with the diaphragm 18a, out of the entire top surface of the substrate 12 having the diaphragm 18a formed thereon (form (ii)). From the viewpoint of preventing separation in the process of dicing, the form (ii) is more preferable.

The diaphragm, unlike other coated layers, has a certain pattern partially opened in the portions corresponded to the lens portions, rather than being formed uniformly and entirely on the substrate, so that the adhesive layer after formation of the diaphragm is not planarized between the opened portion and the portions having the diaphragm formed therein. Such non-uniformity is supposed to adversely affect forms of the lenses formed on the adhesive layer. Also from the viewpoint of appearance, preferably no adhesive layer is formed on the lens portion.

In the form (ii), a particularly preferable embodiment is that the diaphragm 18a is mainly composed of a resin which contains a black filler and highly reactive groups such as hydroxyl group and carboxyl group, represented by epoxy, acryl or allyl ester resin, and also the resin component 16 is similarly composed of a resin having highly reactive groups such as hydroxyl group and carboxyl group, represented by epoxy, acryl or allyl ester resin, because the diaphragm 18a and the resin component 16 reacts while being assisted by energy input for forming the resin component 16, and thereby the adhesive force may be enhanced.

A possible method of forming the adhesive layer 15 only on the portions where the top surface of the substrate 12 expose, out of the entire top surface of the substrate 12 having the diaphragms 18a formed thereon, is such as forming the diaphragm 18a, forming the adhesive layer 15 on the entire surface, and removing the portions of the adhesive layer 15 which fall on the top surface of the diaphragm 18a, with a solvent such as acetone, ethanol and so forth, while the adhesive layer 15 remains removable. In this case, the resin component 16 is provided directly on the top surfaces of the adhesive layer 15 and the diaphragm 18a.

In view of further enhancing the adhesive force, the surfaces of the substrate 12 and the diaphragm 18a preferably have improved wettabilities. In particular, for the case where only the portions where the top surface of the substrate 12 exposes, out of the entire top surface of the substrate 12 having the diaphragm 18a formed thereon, are covered with the adhesive layer 15, and thereby the diaphragm 18a and the resin component 16 are directly bonded to each other (see FIG. 3), the effect of improving the wettability of the surface of the diaphragm 18a becomes distinctive. While it is generally necessary to bond spacers respectively to the topmost and bottommost resin components so as to avoid separation during dicing, the present invention is less causative of problems such as interlayer separation even without the spacers, and thereby the cost may be reduced.

Also the adhesive layer 15 preferably has an improved wettability. A particularly large effect of the improved wettability may be obtained when the adhesive layer 15 is an inorganic adhesive layer. While the wettability may be understood as good enough if each layer has a good wettability with a layer material laid thereon, this may be evaluated approximately by a water contact angle. More specifically, each layer may be understood to has a good wettability with a layer material laid thereon, if each layer has a water contact angle 3° or larger and 30° or smaller, more preferably 3° or larger and 20° or smaller.

While any publicly known techniques are adoptable to reduce the contact angle, particularly preferable ones include surface modification using a UV ozone device, plasma device and so forth.

With the UV ozone device, the contact angle may be reduced under conditions of treatment typically at a UV intensity of 10 mW/cm$^2$ for 3 to 15 minutes or around. With the plasma device, it is preferable to use oxygen as a reaction gas, under conditions of 200 W to 500 W for 30 seconds to 10 minutes or around. Conditions are, of course, not limited thereto, since they may vary depending on states of the surfaces to be treated.

In the present invention, for the case where the silane coupling agent layers are used as the adhesive layers 14, 15, a very strong adhesive force may be obtained by activating the underlying surface before being stacked with the adhesive layers 14, 15, typically by UV ozone treatment or plasma treatment, so as to increase the number of functional groups such as hydroxyl groups to thereby enhance the wettability, and by concurrently allowing the hydroxyl groups to react with the silane coupling agent at a temperature of 100° C. or higher, so as to form siloxane bonds therebetween. For the case where the silane coupling agent layer is arranged right below the resin component 16, a strong adhesive force exerted on the resin component 16 may be obtained by selecting a silane coupling agent highly reactive with a material composing the resin component 16, and by allowing the reaction to proceed with the aid of UV radiation or heat energy input in the process of curing of the resin component 16. The silane coupling agent may be exemplified by those of acryl-base, isocyanate-base, epoxy-base, and amino-base.

There are two possible modes of provision of the resin component: a mode of provision on the entire surface of the underlying layer (adhesive layer, or adhesive layer and diaphragm); and a mode of provision in an island-like manner on the underlying layer. The underlying layer in the mode of island-like provision will have partially exposed portions not covered with the resin component.

The resin component 16 is configured by a convex lens portion 16a and a peripheral non-lens portion 16b, which are molded monolithically. The top surface of the convex lens portion 16a has an aspherical profile. The diaphragm 18a is covered with the non-lens portion 16b.

On the other hand, an adhesive layer 20 is formed on the back surface of the substrate 12. On the back surface of the adhesive layer 20, a diaphragm 18b and an adhesive layer 21 which covers the diaphragms 18b are formed. On the entire back surface of the adhesive layer 21, a resin component 22 is formed.

The adhesive layer 20 is provided between the substrate 12 and the diaphragm 18b, and can enhance the adhesive force of the diaphragm 18b exerted on the substrate 12. The adhesive layer 20 is omissible.

The adhesive layer 21 is provided between a set of the substrate 12 and the diaphragm 18b, and the resin component 22, and can enhance the adhesive force of the resin component 22 exerted on the substrate 12 and the diaphragm 18b.

The diaphragm 18b, the adhesive layer 20 and the adhesive layer 21 are similar to the above-described diaphragm 18a, the adhesive layer 14 and the adhesive layer 15, respectively, so that explanations therefor are omitted.

The resin component 22 is configured by a concave lens portion 22a and a peripheral non-lens portion 22b, which are molded monolithically. The top surface of the concave lens portion 22a has an aspherical profile. The diaphragm 18b is covered with the non-lens portion 22b.

The lens group 8 is configured by the substrate 12, the resin components 16, 22, the diaphragms 18a, 18b, the adhesive layers 14, 20, and the adhesive layers 15, 21.

Next, the lens group 10 will be explained.

The lens group 10 has a substrate 30.

On the top surface of the substrate 30, an adhesive layer 31 is formed. On the entire top surface of the adhesive layer 31, a resin component 32 is formed.

The adhesive layer 31 is provided between the substrate 30 and the resin component 32, and can enhance the adhesive force of the resin component 32 exerted on the substrate 30.

The resin component 32 is configured by a concave lens portion 32a and a peripheral non-lens portion 32b, which are molded monolithically. The top surface of the concave lens portion 32a has an aspherical profile.

On the back surface of the substrate 30, an adhesive layer 33 is formed. On the back surface of the adhesive layer 33, a diaphragm 18c and an adhesive layer 35 which covers the diaphragm 18c are formed. On the entire back surface of the adhesive layer 35, a resin component 34 is formed.

The adhesive layer 33 is provided between the substrate 30 and the diaphragm 18c, and can enhance the adhesive force of the diaphragm 18c exerted on the substrate 30. The adhesive layer 33 is omissible similarly to the adhesive layer 14, and is preferably configured by an organic adhesive layer.

The adhesive layer 35 is provided between a set of the substrate 30 and the diaphragm 18c, and the resin component 34, and can enhance the adhesive force of the resin component 34 exerted on the substrate 30 and the diaphragm 18c.

The resin component 34 is configured by a convex lens portion 34a and a peripheral non-lens portion 34b, which are molded monolithically. The top surface of the convex lens portion 34a has an aspherical profile. The diaphragm 18c is covered with the non-lens portion 34b.

The lens group 10 is configured by the glass substrate 30, the resin components 32, 34, the diaphragm 18c, the adhesive layers 31, 33, and the adhesive layer 35.

The diaphragm 18c, the adhesive layers 31, 33, and the adhesive layer 35 are similar to the above-described diaphragm 18a, the adhesive layer 14, and the adhesive layer 15, respectively, so that explanations therefor are omitted.

The resin components 16, 22 of the lens group 8, and the resin components 32, 34 of the lens group 10 are configured by a publicly known photo-curable resin.

Examples of the photo-curable resin adoptable herein include acryl resin, allyl ester resin, and epoxy-based resin described later.

The acryl resin and the allyl ester resin used herein may be cured by radical polymerization reaction, and the epoxy resin used herein may be cured by cation polymerization reaction.

Species of the resins composing the individual portions of the lens groups 8, 10 may be same to, or different from each other.

Details of the resins will be given by (1) to (3) below.

(1) Acryl Resin (Meth)acrylate used for the polymerization reaction is not specifically limited, so that any (meth)acrylates produced by general methods of manufacturing may be adoptable. These may be exemplified by ester (meth)acrylate, urethane (meth)acrylate, epoxy (meth)acrylate, ether (meth)acrylate, alkyl (meth)acrylate, alkylene (meth) acrylate, aromatic-ring-containing (meth)acrylate, and alicyclic-structured (meth)acrylate. These may be used alone or in combination of two or more species.

The alicyclic-structured (meth)acrylate is particularly preferable, wherein the alicyclic structure may contain an oxygen atom or a nitrogen atom. Examples include cyclohexyl (meth)acrylate, cyclopentyl (meth)acrylate, cycloheptyl (meth) acrylate, bicycloheptyl (meth) acrylate, tricyclodecyl (meth) acrylate, tricyclodecane dimethanol (meth) acrylate, isobornyl (meth)acrylate, and di(meth)acrylates of hydrogen-added bisphenols. Those having an adamantane skeleton are particularly preferable. Examples include 2-alkyl-2-adamantyl (meth)acrylate (see Japanese Laid Open Patent Publication No. 2002-193883), adamantyl di(meth)acrylate (Japanese Laid Open Patent Publication No. S57-500785); diallyl adamantane dicarboxylate (Japanese Laid Open Patent Publication No. S60-100537); perfluoroadamantyl acrylate ester (Japanese Laid Open Patent Publication No. 2004-123687); 2-methyl-2-adamantyl methacrylate, 1,3-adamantanediol diacrylate, and 1,3,5-adamantanetriol triacrylate from Shin-Nakamura Chemical Co., Ltd.; adamantyl ester of unsaturated carboxylic acid (Japanese Laid Open Patent Publication No. 2000-119220); 3,3'-dialkoxycarbonyl-1,1'-biadamantane (see Japanese Laid Open Patent Publication No. 2001-253835); 1,1'-biadamantane compounds (U.S. Pat. No. 3,342,880); tetraadamantane (see Japanese Laid Open Patent Publication No. 2006-169177); adamantane skeleton-containing curable resins without aromatic ring such as 2-alkyl-2-hydroxyadamantane, 2-alkylene adamantane, di-tert-butyl 1,3-adamantane dicarboxylate (see Japanese Laid Open Patent Publication No. 2001-322950); and bis(hydroxyphenyl)adamantanes, and bis(glycidyloxy phenyl)adamantane (see Japanese Laid Open Patent Publication Nos. H11-35522 and H10-130371).

The acryl resin may also contain other reactive monomers. (Meth)acrylate may be exemplified by methyl acrylate, methyl methacrylate, n-butyl acrylate, n-butyl methacrylate, 2-ethylhexyl acrylate, 2-ethylhexyl methacrylate, isobutyl acrylate, isobutyl methacrylate, Cert-butyl acrylate, tert-butyl methacrylate, phenyl acrylate, phenyl methacrylate, benzyl acrylate, benzyl methacrylate, cyclohexyl acrylate, and cyclohexyl methacrylate.

Polyvalent (meth)acrylate may be exemplified by trimethyloipropane tri(meth)acrylate, pentaerythritol tetra(meth)acrylate, pentaerythritol tri(meth)acrylate, dipentaerythritol hexa(meth)acrylate, dipentaerythritol penta(meth)acrylate, dipentaerythritol tetra(meth)acrylate, dipentaerythritol tri(meth)acrylate, tripentaerythritol octa(meth)acrylate, tripentaerythritol septa(meth)acrylate, tripentaerythritol hexa(meth)acrylate, tripentaerythritol penta(meth)acrylate, tripentaerythritol tetra(meth)acrylate, and tripentaerythritol tri(meth)acrylate.

(2) Allyl Ester Resin

The allyl ester resin relates to a resin containing allyl group and curable by radical-polymerizaion. The allyl ester resin is exemplified by those listed below, but not specifically limited thereto.

Examples include bromine-containing (meth)allyl ester having no aromatic ring (see Japanese Laid Open Patent Publication No. 2003-66201); allyl (meth)acrylate (Japanese Laid Open Patent Publication No. H05-286896); allyl ester resin (see Japanese Laid Open Patent Publication Nos. H05-286896 and 2003-66201); copolymer of acrylate ester and epoxy group-containing unsaturated compound (see Japanese Laid Open Patent Publication No. 2003-128725); acrylate compounds (see Japanese Laid Open Patent Publication No. 2003-147072); and acryl ester compounds (see Japanese Laid Open Patent Publication No. 2005-2064).

(3) Epoxy Resin

The epoxy resin is not specifically limited so long as it has epoxy groups and may be curable by polymerization assisted by light or heat. Acid anhydride or cation generator may be used as a curing initiator. The epoxy resin is preferable in view of producing lenses with high molding accuracy, by virtue of its small cure shrinkage.

The epoxy resin may be exemplified by novolac phenol-type epoxy resin, biphenyl-type epoxy resin, and dicyclopentadiene-type epoxy resin. Examples include bisphenol F diglycidyl ether, bisphenol A diglycidyl ether, 2,2'-bis(4-glycidyloxycyclohexyl)propane, 3,4-epoxycyclohexylmethyl-3,4-epoxycyclohexane carboxylate, vinylcyclohexene dioxide, 2-(3,4-epoxycyclohexyl)-5,5-spiro-(3,4-epoxycyclohexane)-1,3-dioxane, bis(3,4-epoxycyclohexyl) adipate, and bisglycidyl ester of 1,2-cyclopropane dicarboxylic acid.

The curing agent is used for composing the curable resin material, but not specifically limited.

Acid anhydride curing agent, phenol curing agent and so forth are preferably used as the curing agent. Specific examples of the acid anhydride curing agent include phthalic anhydride, maleic anhydride, trimellitic anhydride, pyromellitic anhydride, hexahydrophthalic anhydride, 3-methyl-hexahydrophthalic anhydride, 4-methyl-hexahydrophthalic anhydride, mixture of 3-methyl-hexahydrophthalic anhydride and 4-methyl-hexahydrophthalic anhydride, tetrahydrophthalic anhydride, nadic anhydride, and methyl nadic anhydride. A curing accelerator may optionally be contained. The curing accelerator is not specifically limited so long as it exhibits a good curability, not causative of coloration, and does not degrade transparency of the curable resin. Examples include imidazoles such as 2-ethyl-4-methylimidazole (2E4MZ); tertiary amine; quaternary ammonium salt; bicyclic amidines and derivatives thereof such as diazabicycloundecene; phospine; and phosphonium salt. These may be used alone or in combination of two or more species.

In the image capture lens 2, an adhesive is coated between the non-lens portion 22b of the lens group 8 and the non-lens portion 32b of the lens group 10, so as to bond the lens group 8 and the lens group 10. The non-lens portions 22b, 32b correspond to the flanges of the concave lens portions 22a, 32a.

The lens group 10 has a spacer 7 bonded thereto. The spacer 7 has openings 7a formed therein, in which the convex lens portion 16a, the concave lens portion 22a, concave lens portion 32a, and the convex lens portion 34a are arranged.

In the image capture lens 2, the convex lens portion 16a, the concave lens portion 22a, the concave lens portion 32a, the convex lens portion 34a, and each opening 7a of the spacer 7 respectively have aspherical surfaces, while being aligned on a single optical axis.

In particular in the image capture lens 2, the convex lens portion 16a of the lens group 8 is arranged on the object side, and the convex lens portion 34a of the lens group 10 is arranged on the image side.

The convex lens portion 16a configures "surface S1" as the object-side optical surface of the lens group 8, the concave lens portion 22a configures "surface S2" as the image-side optical surface of the lens group 8, the concave lens portion 32a configures "surface S3" as the object-side optical surface of the lens group 10, and the convex lens portion 34a configures "surface S4" as the image-side optical surface of the lens group 10, which are arranged from the object side towards the image side.

In the image capture lens 2, an IR cut film (not illustrated) may be formed on the substrate 12. The IR cut film is formed by publicly-known vacuum evaporation process, sputtering or CVD (Chemical Vapor Deposition), respectively on both of the top and back surfaces of the substrate 12. The IR cut film (infrared shielding film) is a film for shielding infrared radiation, and has a tranmissivity of 50% or larger with respect to light having a wavelength of 365 nm.

Accordingly, the substrate in the context of the present invention includes not only a glass substrate alone by itself, but also a combined substrate having the above-described IR cut film formed on the glass substrate.

For the case where the IR cut film is formed, the film is preferably configured so as to alternately stack silicon dioxide layers and titanium dioxide layers or the like, wherein the topmost layer is preferably a silicon dioxide layer which is same as the glass substrate.

[Method of Manufacturing Image Capture Device (Image Capture Lens)]

Figure 2:
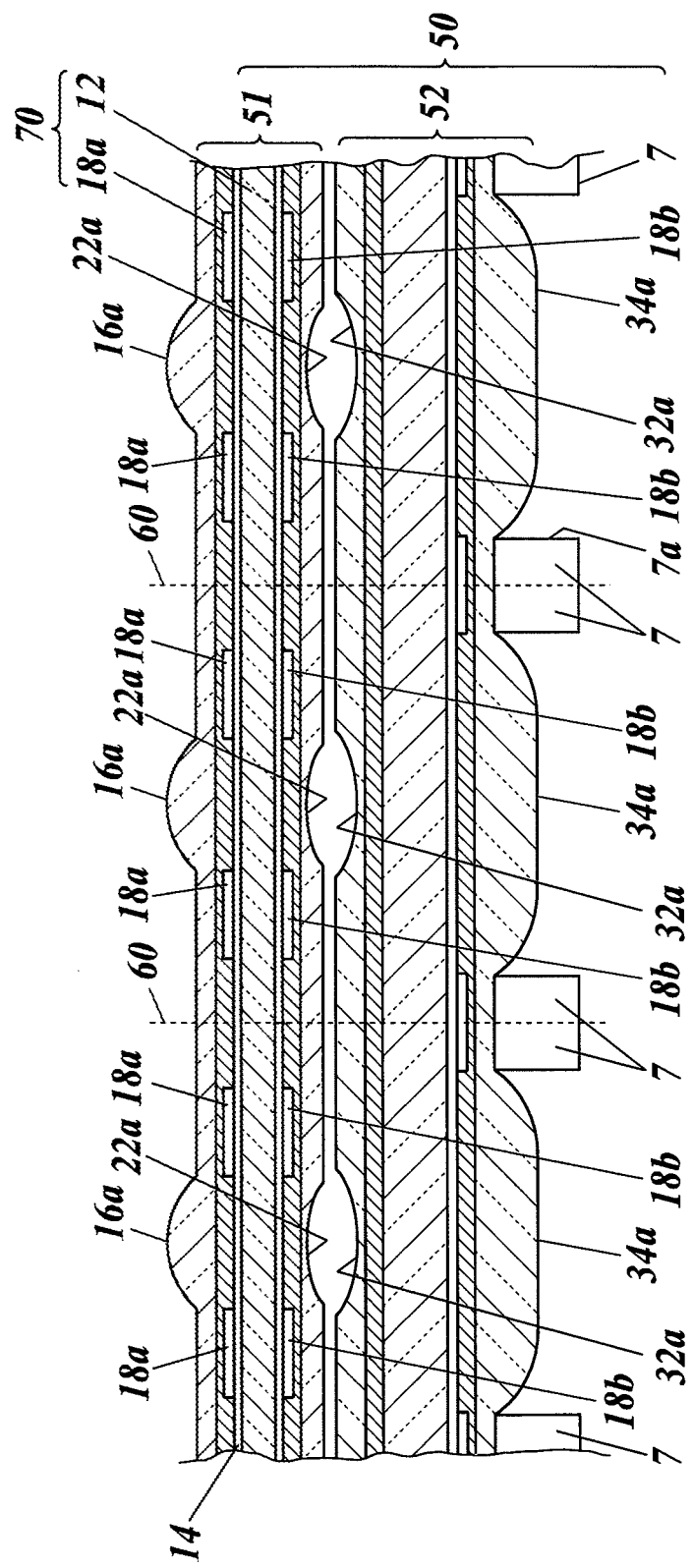
[FIG. 2] This is a drawing schematically explaining dicing of a wafer lens laminate manufactured in the process of manufacturing of the image capture lens.

Next, a method of manufacturing the image capture device 1 (including methods of manufacturing the image capture lens intermediate product 70, a wafer lens 51, a wafer lens laminate 50 and an image capture lens 2) will be briefed, referring to FIG. 1 to FIG. 3.

First, a light-intercepting photoresist, for example, is coated on the substrate 12, patterned into a predetermined geometry, and thereby plurality of diaphragms 18a are formed (diaphragm forming process). A photoresist mixed with carbon black may be adoptable to the light-shielding photoresist.

It is preferable to preliminarily subject the substrate 12 to surface modification treatment using a UV ozone device or a plasma device or the like (surface modification process). By the above process, an intermediate product 70 of the image capture lens 2, having the diaphragms 18a formed on the substrate 12, is obtained. It is also preferable, in advance of the diaphragm forming process, to form the organic adhesive layer 14 on the substrate 12, by vapor phase deposition process or coating process.

Also the substrate having the diaphragm formed thereon is preferably subjected to surface modification treatment using a UV ozone device or a plasma device or the like (surface modification process).

Thereafter, on the substrate 12 having the diaphragms 18a formed thereon, the adhesive layer 15 is formed by vapor phase deposition process or coating process (adhesive layer forming process).

After the adhesive layer 15 was formed, for the case where only portions of the exposed top surface of the substrate 12, out of the entire top surface of the substrate having the diaphragms 18a formed thereon, are finally covered with the adhesive layer 15 (in other words, the top surface of the diaphragms 18a are left uncovered) as illustrated in FIG. 3, portions of the adhesive layer 15 which fall on the diaphragms 18a is removed (adhesive layer removing process). Solvent such as acetone, ethanol or the like may be used for the removal.

On the other hand, for the case where the adhesive layer 15 covers the entire surfaces of the substrate 12 and the diaphragms 18a as illustrated in FIG. 1, the adhesive layer removing process is not performed.

A photo-curable resin is then dropped into a molding die, filled between the molding die and the wafer-like substrate 12 by pressing either one of which against the other, and allowed to cure under irradiation of light. As a consequence, a plurality of convex lens portions 16a are formed on the organic or inorganic adhesive layer on the substrate 12 (molding process).

The substrate 12 is then turned over, and the adhesive layer 20, the plurality of diaphragms 18b, the adhesive layer 21, and the plurality of concave lens portions 22a are formed on the substrate 12, similarly as described in the above.

After the lens portions 16a and 22a are formed, the molding die is released from the substrate 12. The molding die may be released respectively after formation of the convex lens portion 16a and formation of the concave lens portion 22a, or may be released once en bloc after formation of the lens portions 16a, 22a on both surfaces.

After the mold releasing, the lens portions 16a, 22a formed on both surfaces of the substrate 12 are annealed for post curing. The post curing may be given once en bloc for the lens portions 16a, 22a formed on both surfaces, or may be given respectively after mold releasing from the lens portions 16a, 22a, for each lens portion one-by-one.

After the mold releasing, the first wafer lens 51 having a plurality of lens portions 16a, 22a formed thereon is manufactured (see FIG. 2).

Thereafter, similarly to the manufacturing of the above-described first wafer lens 51, the plurality of diaphragms 18c, the adhesive layer 31, the adhesive layer 33, the adhesive layer 35, the plurality of concave lens portions 32a, and the convex lens portions 34a are formed also on the substrate 30, and the molds are released. The mold releasing is followed by post-curing. For the substrate 30, coating of the IR cut film is omissible.

Thereafter, an anti-reflection film (not illustrated) is preferably formed on the resin component 34. The anti-reflection film has a double-layered structure. A first layer is formed directly on the resin component 34, and a second layer is formed thereon.

The first layer is a layer composed of a high-refractive-index material having a refractive index of 1.7 or larger, and is preferably configured by either a mixture of $Ta_2O_5$, $Ta_2O_5$ and $TiO_2$, or a mixture of $ZrO_2$, $ZrO_2$ and $TiO_2$. The first layer may alternatively be composed of $TiO_2$, $Nb_2O_3$ and $HfO_2$.

The second layer is a layer composed of a low-refractive-index material having a refractive index of smaller than 1.7, and is preferably composed of $SiO_2$.

Both of the first layer and the second layer of the anti-reflection film are formed by a technique such as evaporation, and are preferably formed while being kept in the temperature range from −40 to +40° C. (preferably from −20 to +20° C.) with respect to the melting temperature of an electro-conductive paste such as solder used in the reflow process.

By forming the anti-reflection film in this way, a second wafer lens 52 (see FIG. 2), having the plurality of lens portions 32a, 34a, is manufactured.

An adhesive is then coated at least on either one of the non-lens portions 22b, 32b, and the first and second wafer lenses 51, 52 are bonded to each other (stacking process) (see FIG. 2).

An adhesive is then coated on at least either one of the spacer 7, and the non-lens portion 34b of the lens group 10, and the spacer 7 and the lens group 10 are bonded to each other.

In this way, the wafer lens laminate 50 is manufactured (see FIG. 2).

The wafer lens laminate 50 is then diced along dicing lines 60 using a dicer or the like, so as to singulate a set as illustrated in FIG. 2, where the set is an assumed unit composed of the convex lens portion 16a, the concave lens portion 22a, the concave lens portion 32a, and the convex lens portion 34a (dicing process).

In this way, a plurality of image capture lenses 2 are manufactured.

The resin components 16, 22, 32 and 34 may preferably be diced typically by using a dicer equipped with a rotary blade, at the number of rotation of 3,000 rpm to 50,000 rpm, and at a cutting speed of 1 to 10 mm/sec.

The resin components 16, 22, 32 and 34 are preferably diced from the resin component 16 on the object side towards the resin component 34 on the image side. Since sites of the resin components 16, 22, 32 and 34 being diced produce dust, so that the dicing is preferably proceeded while supplying (jetting) water to the site of dicing for dust prevention.

The thus-obtained image capture lens 2 is assembled (bonded), and the cover glass 4 and the image capture element are installed, to thereby manufacture the image capture device 1.

While the cover glass 4 and the image capture element in this embodiment were installed after the image capture lens 2 was manufactured by dicing, the image capture device 1 may alternatively be obtained by stacking the wafer lens laminate 50 and the substrate having a plurality of image capture elements provided thereto, followed by dicing.

While the diaphragm is not provided on the surface S3 (top surface of the substrate 30) in this embodiment, the diaphragm may be provided.

For an exemplary case of manufacturing electronic instruments, where the image capture device 1 and other electronic components are mounted on a printed wiring board, solder may preliminarily be placed on the printed wiring board, the image capture device 1 and the electronic components may be placed thereon, the work may be placed and heated in an IR reflow oven so as to melt the solder, followed by cooling. This enables concurrent mounting of the image capture device 1 and the electronic components on the printed wiring board.

EXAMPLES

The present invention will be explained specifically by referring to Examples and Comparative Examples.

Example 1

Manufacturing of First Wafer Lens

On one surface of a borosilicate glass substrate of 0.6 mm thick, on which the water contact angle preliminarily measured, a metal film of a total thickness of 800 nm composed of a plurality of chromium oxide layers was formed, and a positive photoresist was coated thereon and dried according to publicly-known methods. The resist was exposed to light through a mask, developed, and annealed at 130° C. for 2 minutes. The chromium compound in the exposed area was removed by etching, the unused resist was removed, so as to form the diaphragms having a light-transmissive portion and alignment marks. After measuring the water contact angle on the surface of the diaphragms, a titanium oxide layer of 20 nm thick was formed as an adhesive layer by vapor phase deposition process. A cation-polymerizable epoxy resin was then dropped on the titanium oxide layer, and the resin was exposed to light and allowed to cure while being pressed under a master (molding die).

The master was then released, to produce a first wafer lens in which the resin component having the lens portions is bonded directly to the entire surface of the adhesive layer (see Table 1 below).

Manufacturing of Image Capture Lens

The first wafer lens was diced in the area between the lenses, using a publicly known dicer at a number of rotation of blade of 20,000 rpm and a cutting speed of 4 mm/s, from the surface S1 (top surface), to thereby obtain 60 image capture lenses.

Evaluation of Separation after Dicing

The cross sections of the image capture lenses obtained by dicing was observed under a microscope, and the number of the lenses showing complete separation or slight separation between the layers were counted. Those showing separation between the lenses and the spacers were not included into the count. The image capture lenses were found to cause separation at frequencies listed in Table 2 below.

Example 2

Manufacturing of First Wafer Lens

The processes up to the diaphragm forming process were proceeded similarly as described in Example 1. Next, on the glass substrate having the diaphragms formed thereon, an amino-based silane coupling agent (a 1 wt % ethanol solution of Z-6020 from Dow Corning Toray Co., Ltd.) was coated using a spin coater, and the work was heated on a hot plate at 150° C. for 30 minutes, to thereby form a silane coupling agent layer which forms siloxane bonds bound to the glass substrate having the diaphragms formed thereon. A cation-polymerizable epoxy resin was then dropped thereon, exposed to light and allowed to cure while being pressed under a master (molding die), and concurrently allowed to bind tightly with the silane coupling agent layer with the aid of energy of irradiated light.

The master was then released, to produce a first wafer lens in which the resin component having the lens portions is bonded directly to the entire surface of the adhesive layer (see Table 1 below).

(Manufacturing of Image Capture Lens) and (Evaluation of Separation after Dicing) were performed similarly as described in Example 1. Results were shown in Table 2 below.

Example 3

Manufacturing of First Wafer Lens

One surface of a borosilicate glass substrate of 0.6 mm thick was treated using a UV ozone cleaning system UV-208 from Technovision Inc. for 5 minutes, and the water contact angle was measured thereon. The diaphragm forming process was proceeded similarly as described in Example 1, the substrate having the diaphragms formed thereon was then treated using the UV ozone cleaning system for 5 minutes, and the water contact angle was measured thereon. Next, a silicon oxide layer of 20 nm thick was formed as the adhesive layer by vapor phase deposition process, and an amino-based silane coupling agent layer was formed similarly as described in Example 2.

A cation-polymerizable epoxy resin was then dropped on the silane coupling layer, exposed to light and allowed to cure while being pressed under a master (molding die), and concurrently allowed to bind tightly with the silane coupling agent layer with the aid of energy of irradiated light.

The master was then released, to produce a first wafer lens in which the resin component having the lens portions is bonded directly to the entire surface of the adhesive layer (see Table 1 below).

(Manufacturing of Image Capture Lens) and (Evaluation of Separation after Dicing) were performed similarly as described in Example 1. Results were shown in Table 2 below.

Example 4

Manufacturing of First Wafer Lens

On one surface of a borosilicate glass substrate of 0.6 mm thick, on which the water contact angle preliminarily measured, a negative resist material containing a black filler and epoxy resin was coated by spin coating, and dried, to thereby form a 2-μm-thick film. The resist was then exposed to light through a mask, developed, and annealed at 200° C. for 20 minutes, to thereby form the diaphragms having a light-transmissive portion and alignment marks. After measuring the water contact angle on the surface of the diaphragms, a mask was formed on the diaphragms, and a silicon oxide film of 20 nm thick was formed by vapor phase deposition process on the portions other than the diaphragms, the mask was removed, and an epoxy-based silane coupling agent (a 1 wt % ethanol solution of KBM403 from Shin-Etsu Silicone Co., Ltd.) layer was formed, similarly as described in Example 2. The epoxy-based silane coupling agent layer on the diaphragms was wiped off with acetone, since it exhibits only a weak bonding strength with the diaphragms.

A cation-polymerizable epoxy resin was then dropped thereon, exposed to light and allowed to cure while being pressed under a master (molding die), and concurrently allowed to bind tightly with the silane coupling agent layer and the diaphragms with the aid of energy of irradiated light.

The master was then released, to produce a first wafer lens in which the resin layer having the lens portions is bonded directly to the adhesive layer, and to the diaphragms (see Table 1 below).

(Manufacturing of Image Capture Lens) and (Evaluation of Separation after Dicing) were performed similarly as described in Example 1. Results were shown in Table 2 below.

Example 5

Manufacturing of First Wafer Lens

The processes up to the diaphragm forming process were proceeded similarly as described in Example 4. The water contact angle was measured on the surface of the diaphragms, and an one-part acrylic adhesive was printed on the diaphragms to a thickness of 6 μm by screen printing, and the work was dried on a hot plate at 100° C. for 5 minutes.

A radical-polymerizable acryl resin was then dropped thereon, exposed to light and allowed to cure while being pressed under a master (molding die), and concurrently allowed to bind tightly with the adhesive layer with the aid of energy of irradiated light.

The master was then released, to produce a first wafer lens in which the resin component having the lens portions is bonded directly to the entire surface of the adhesive layer (see Table 1 below).

(Manufacturing of Image Capture Lens) and (Evaluation of Separation after Dicing) were performed similarly as described in Example 1. Results were shown in Table 2 below.

Example 6

Manufacturing of First Wafer Lens

The processes up to the diaphragm forming process were proceeded similarly as described in Example 4. The water contact angle was measured on the surface of the diaphragms, and a silicon oxide layer of 20 nm thick was formed as the adhesive layer by vapor phase deposition process, and an amino-based silane coupling agent layer was formed similarly as described in Example 2. The epoxy-based silane coupling agent layer on the diaphragms was wiped off with acetone.

A radical-polymerizable acryl resin was then dropped thereon, exposed to light and allowed to cure while being pressed under a master (molding die), and concurrently allowed to bind tightly with the silane coupling agent layer and the diaphragms with the aid of energy of irradiated light.

The master was then released, to produce a first wafer lens in which the resin layer having the lens portions is bonded directly to the adhesive layer, and to the diaphragms (see Table 1 below).

(Manufacturing of Image Capture Lens) and (Evaluation of Separation after Dicing) were performed similarly as described in Example 1. Results were shown in Table 2 below.

Example 7

Manufacturing of First Wafer Lens

On one surface of a borosilicate glass substrate of 0.6 mm thick, on which the water contact angle preliminarily measured, an isocyanate-based silane coupling agent (a 1 wt % ethanol solution of KBE-9007 from Shin-Etsu Silicone Co., Ltd.) was coated using a spin coater, and the work was heated on a hot plate at 150° C. for 30 minutes, to thereby form a silane coupling agent layer which forms siloxane bonds bound to the substrate.

Next, a negative resist material containing a black filler and acryl resin was coated by spin coating on the silane coupling agent layer, and dried, to thereby form a 2-µm-thick film. The resist was exposed to light through a mask, developed, and annealed at 220° C. for 20 minutes, to thereby form the diaphragms having a light-transmissive portion and alignment marks. After measuring the water contact angle on the surface of the diaphragms, a mask was formed on the diaphragms, and a titanium oxide layer of 20 nm thick was formed by vapor phase deposition process on the portions other than the diaphragms, the mask was removed, and an epoxy-based silane coupling agent (a 1 wt % ethanol solution of KBM403 from Shin-Etsu Silicone Co., Ltd.) layer was formed, similarly as described in Example 2. The epoxy-based silane coupling agent layer on the diaphragms was wiped off with acetone.

A radical-polymerizable acryl resin was then dropped thereon, exposed to light and allowed to cure while being pressed under a master (molding die), and concurrently allowed to bind tightly with the silane coupling agent layer and the diaphragms with the aid of energy of irradiated light.

The master was then released, to produce a first wafer lens in which the resin layer having the lens portions is bonded directly to the adhesive layer, and to the diaphragms (see Table 1 below).

(Manufacturing of Image Capture Lens) and (Evaluation of Separation after Dicing) were performed similarly as described in Example 1. Results were shown in Table 2 below.

Example 8

Manufacturing of First Wafer Lens

The first wafer lens was manufactured similarly as described in Example 7, and a glass spacer of 0.6 mm thick was bonded to the resin layer having the lens portions formed therein using an adhesive, to thereby manufacture a first wafer lens with spacer (see Table 1 below).

(Manufacturing of Image Capture Lens) and (Evaluation of Separation after Dicing) were performed similarly as described in Example 1. Results were shown in Table 2 below.

Example 9

Manufacturing of First Wafer Lens

On one surface of a borosilicate glass substrate of 0.6 mm thick, on which the water contact angle preliminarily measured, an acryl-based silane coupling agent (a 1 wt % ethanol solution of SZ6030 from Dow Corning Toray Co., Ltd.) was coated using a spin coater, and the work was heated on a hot plate at 150° C. for 30 minutes, to thereby form a silane coupling agent layer which forms siloxane bonds bound to the substrate. The processes thereafter were proceeded similarly as described in Example 7 (see Table 1 below).

(Manufacturing of Image Capture Lens) and (Evaluation of Separation after Dicing) were performed similarly as described in Example 1. Results were shown in Table 2 below.

Example 10

Manufacturing of First Wafer Lens

On one surface of a borosilicate glass substrate of 0.6 mm thick, on which the water contact angle is preliminarily measured, an isocyanate-based silane coupling agent (a 1 wt % ethanol solution of a 1 wt % ethanol solution of KBE-9007 from Shin-Etsu Silicone Co., Ltd.) was coated using a spin coater, and the work was heated on a hot plate at 150° C. for 30 minutes, to thereby form a silane coupling agent layer which forms siloxane bonds bound to the substrate. The processes thereafter were proceeded similarly as described in Example 7, except that the epoxy-based silane coupling agent layer on the diaphragms was wiped off with ethanol (see Table 1 below).

(Manufacturing of Image Capture Lens) and (Evaluation of Separation after Dicing) were performed similarly as described in Example 1. Results were shown in Table 2 below.

Example 11

Manufacturing of First Wafer Lens

One surface of a borosilicate glass substrate of 0.6 mm thick was treated using a UV ozone cleaning system UV-208 from Technovision Inc. for 5 minutes, and the water contact angle was measured thereon. The diaphragm forming process was proceeded similarly as described in Example 7, the substrate having the diaphragms formed thereon was then treated using the UV ozone cleaning system for 5 minutes, and the water contact angle was measured thereon. Next, a double-layered adhesive layer was formed similarly as described in Example 10, and the epoxy-based silane coupling agent layer on the diaphragms was wiped off with ethanol.

A radical-polymerizable acryl resin was then dropped thereon, exposed to light and allowed to cure while being pressed under a master (molding die), and concurrently allowed to bind tightly with the silane coupling agent layer and the diaphragms with the aid of energy of irradiated light.

The master was then released, to produce a first wafer lens in which the resin layer having the lens portions is bonded directly to the adhesive layer, and to the diaphragms (see Table 1 below).

(Manufacturing of Image Capture Lens) and (Evaluation of Separation after Dicing) were performed similarly as described in Example 1. Results were shown in Table 2 below.

Example 12

Manufacturing of First Wafer Lens

One surface of a borosilicate glass substrate of 0.6 mm thick was treated using a plasma apparatus PD-2203L from SAMCO Inc. fed with oxygen, at 200 W for 2 minutes, and the water contact angle was then measured. The diaphragm forming process was proceeded similarly as described in Example 7. Thereafter, the substrate having the diaphragms formed thereon was again treated similarly using the plasma apparatus for 2 minutes, and the water contact angle was measured. The processes for forming the adhesive layer and thereafter were proceeded similarly as described in Example 10 (see Table 3 below).

(Manufacturing of Image Capture Lens) and (Evaluation of Separation after Dicing) were performed similarly as described in Example 1. Results were shown in Table 4 below.

Example 13

Manufacturing of First Wafer Lens

One surface of a borosilicate glass substrate of 0.6 mm thick was treated using a plasma apparatus PD-2203L from SAMCO Inc. fed with oxygen, at 200 W for 4 minutes, and the water contact angle was then measured. The diaphragm forming process was proceeded similarly as described in Example 7. Thereafter, the substrate having the diaphragms formed thereon was again treated similarly using the plasma apparatus for 4 minutes, and the water contact angle was measured. The processes for forming the adhesive layer and thereafter were proceeded similarly as described in Example 10 (see Table 3 below).

(Manufacturing of Image Capture Lens) and (Evaluation of Separation after Dicing) were performed similarly as described in Example 1. Results were shown in Table 4 below.

Example 14

Manufacturing of First Wafer Lens

One surface of a borosilicate glass substrate of 0.6 mm thick was treated using a plasma apparatus PD-2203L from SAMCO Inc. fed with oxygen, at 400 W for 6 minutes, and the water contact angle was then measured. The diaphragm forming process was proceeded similarly as described in Example 4. Thereafter, the substrate having the diaphragms formed thereon was again treated similarly using the plasma apparatus for 6 minutes, and the water contact angle was measured. The processes for forming the adhesive layer and thereafter were proceeded similarly as described in Example 10, except that a cation-polymerizable epoxy resin was used for forming the lenses (see Table 3 below).

(Manufacturing of Image Capture Lens) and (Evaluation of Separation after Dicing) were performed similarly as described in Example 1. Results were shown in Table 4 below.

Example 15

Manufacturing of First Wafer Lens

The lens portions (surface S1) were formed on one surface of a 0.6-mm-thick borosilicate glass substrate by the same procedures as described in Example 5, and the lens portions (surface S2) were formed on the other surface by the same procedures, to thereby manufacture a first wafer lens in which the resin components having the lens portions formed therein are bonded directly to the entire surfaces of the adhesive layers on both surfaces of the substrate (see Table 3 below).

(Manufacturing of Image Capture Lens) and (Evaluation of Separation after Dicing) were performed similarly as described in Example 1. Results were shown in Table 4 below.

Example 16

Manufacturing of First Wafer Lens

The lens portions (surface S1) were formed on one surface of a 0.6-mm-thick borosilicate glass substrate by the same procedures as described in Example 4, and the lens portions (surface S2) were formed on the other surface by the same procedures, to thereby manufacture a first wafer lens in which the resin layers having the lens portions formed therein are bonded directly to the adhesive layers, and to the diaphragms on both surfaces of the substrate (see Table 3 below).

(Manufacturing of Image Capture Lens) and (Evaluation of Separation after Dicing) were performed similarly as described in Example 1. Results were shown in Table 4 below.

Example 17

Manufacturing of First Wafer Lens

The lens portions (surface S1) were formed on one surface of a 0.6-mm-thick borosilicate glass substrate by the same procedures as described in Example 12, except that an acryl-based silane coupling agent was used for the adhesive layer (upper layer) after the diaphragm forming process. Thereafter, the lens portions (surface S2) were formed on the other surface by the same procedures. Next, a 0.6-mm-thick glass spacer was bonded to the surface S2 using an adhesive, to thereby manufacture a first wafer lens in which the resin layers having the lens portions formed therein are bonded directly to the adhesive layers, and to the diaphragms on both surfaces of the substrate (see Table 3 below).

(Manufacturing of Image Capture Lens) and (Evaluation of Separation after Dicing) were performed similarly as described in Example 1. Results were shown in Table 4 below.

Example 18

Manufacturing of First Wafer Lens

A first wafer lens having the lens portions on the surface S1 and the surface S2 was manufactured by the same procedures as described in Example 17, except that the spacer was not bonded (see Table 1 below).

Manufacturing of Second Wafer Lens

A second wafer lens having the lens portions on the surface S3 and the surface S4 was manufactured similarly to the first wafer lens (see Tables 3 and 4 below).

(Bonding of First Wafer Lens and Second Wafer Lens)

The thus-manufactured first wafer lens and the second wafer lens were bonded using an adhesive, to thereby produce a wafer lens laminate having two wafer lenses stacked therein.

(Manufacturing of Image Capture Lens) and (Evaluation of Separation after Dicing) were performed similarly as described in Example 1. Results were shown in Table 4 below.

Example 19

Manufacturing of First Wafer Lens

Manufacturing of Second Wafer Lens

Bonding of First Wafer Lens and Second Wafer Lens

The first and second wafer lenses were manufactured by the same procedures as described in Example 18, to thereby produce a wafer lens laminate having the first and second wafer lenses stacked therein. Next, a 0.6-mm-thick glass spacer was bonded to the surface S4 of the wafer lens laminate using an adhesive (see Tables 3 and 4 below).

(Manufacturing of Image Capture Lens (single chip)) and (Evaluation of Separation after Dicing) were performed similarly as described in Example 1. Results were shown in Table 4 below.

Comparative Example 1

Manufacturing of First Wafer Lens

The processes up to the diaphragm forming process were proceeded similarly as described in Example 1. Thereafter, without forming the adhesive layer, a radical-polymerizable acryl resin was dropped on the substrate having the diaphragms formed thereon, exposed to light, and allowed to cure while being pressed under a master (molding die).

The master was then released, to produce a first wafer lens (see Table 3 below).

(Manufacturing of Image Capture Lens (single chip)) and (Evaluation of Separation after Dicing) were performed similarly as described in Example 1. Results were shown in Table 4 below.

Comparative Example 2

Manufacturing of First Wafer Lens

On one surface of a 0.6-mm-thick borosilicate glass substrate, the lens portions (surface S1) were formed by the same procedures as described in Example 4, except that a negative resist material containing a black filler and acryl resin was used for forming the diaphragms. Thereafter, without forming the adhesive layer, a radical-polymerizable acryl resin was dropped on the substrate having the diaphragms formed thereon, exposed to light, and allowed to cure while being pressed under a master (molding die).

The master was then released to produce the lens portions (surface S1), and the lens portions (surface S2) were formed by the same procedures on the other surface. Thereafter, a 0.6-mm-thick glass spacer was bonded to the surface S2 using an adhesive, to thereby produce a first wafer lens with spacer having the lens portions formed on both surfaces of the substrate (see Table 3 below).

(Manufacturing of Image Capture Lens) and (Evaluation of Separation after Dicing) were performed similarly as described in Example 1. Results were shown in Table 4 below.

Comparative Example 3

Manufacturing of First Wafer Lens

A first wafer lens having the lens portions formed on the surface S1 and the surface S2 was manufactured by the same procedures as described in Example 21 (Comparative Example 2).

Manufacturing of Second Wafer Lens

A second wafer lens having the lens portions on the surface S3 and surface S4 was manufactured similarly to the first wafer lens (see Tables 3 and 4 below).

Bonding of First Wafer Lens and Second Wafer Lens

The thus-manufactured first wafer lens and the second wafer lens were bonded using an adhesive, to thereby produce a wafer lens laminate having two wafer lenses stacked therein. Next, 0.6-mm-thick glass spacers were bonded to the surface S1 and the surface S4 of the wafer lens stacks using an adhesive (see Table 1 below).

(Manufacturing of Image Capture Lens) and (Evaluation of Separation after Dicing) were performed similarly as described in Example 1. Results were shown in Table 4 below.

TABLE 1

First wafer lens 51

| | First substrate 12 | Surface S1: topmost Surface modification treatment | Water contact angle[°] | Adhesive layer 14 | Diaphragm 18a | Surface modification treatment | Water contact angle[°] | Adhesive layer 15 Lower layer | Upper layer | Removal of adhesive layer | Lens: resin layer 16 | State of bonding at interfaces |
|---|---|---|---|---|---|---|---|---|---|---|---|---|
| Example 1 | Borosilicate glass | — | 47 | — | Chromium oxide base | — | 54 | TiO2 | — | — | Epoxy base | Resin layer entirely bonded on entire surface of adhesive layer |
| Example 2 | ↑ | — | ↑ | — | ↑ | — | ↑ | — | Amino-based silane coupling agent | — | ↑ | ↑ |
| Example 3 | ↑ | UV ozone, 5 min | 25 | — | ↑ | UV ozone, 5 min | 29 | SiO2 | Amino-based silane coupling agent | — | ↑ | ↑ |
| Example 4 | ↑ | — | 47 | — | Black filler + epoxy base | — | 49 | SiO2 | Epoxy-based silane coupling agent | Acetone | ↑ | Resin layer bonded to adhesive layer and diaphragm |
| Example 5 | ↑ | — | ↑ | — | ↑ | — | ↑ | Acryl-based adhesive | — | — | Acryl base | Resin layer entirety bonded on entire surface of adhesive layer |
| Example 6 | ↑ | — | ↑ | — | ↑ | — | ↑ | SiO2 | Amino-based silane coupling agent | Acetone | ↑ | Resin layer bonded to adhesive layer and diaphragm |
| Example 7 | ↑ | — | ↑ | Isocyanate-based silane coupling agent | Black filler + acryl base | — | 51 | TiO2 | Epoxy-based silane coupling agent | Acetone | ↑ | ↑ |
| Example 8 | ↑ | — | ↑ | ↑ | ↑ | — | ↑ | ↑ | ↑ | Acetone | ↑ | ↑ |
| Example 9 | ↑ | — | ↑ | Acryl-based silane coupling agent | ↑ | — | ↑ | ↑ | ↑ | Acetone | ↑ | ↑ |

TABLE 1-continued

| | First wafer lens 51 | | | | | | | | | | | |
|---|---|---|---|---|---|---|---|---|---|---|---|---|
| Example 10 | ↑ | — | ↑ | Isocyanate-based silane coupling agent | ↑ | — | ↑ | ↑ | ↑ | Ethanol | ↑ | ↑ |
| Example 11 | ↑ | UV ozone, 5 min | 25 | — | ↑ | UV ozone, 5 min | 27 | ↑ | ↑ | ↑ | ↑ | ↑ |

| | Surface S2 Surface modification treatment | Water contact angle[°] | Adhesive layer 20 | Diaphragm 18b | Surface modification treatment | Water contact angle[°] | Adhesive layer 21 Lower layer | Upper layer | Removal of adhesive layer | Lens: resin layer 22 | State of bonding at interfaces |
|---|---|---|---|---|---|---|---|---|---|---|---|
| Example 1 | — | — | — | — | — | — | — | — | — | — | — |
| Example 2 | — | — | — | — | — | — | — | — | — | — | — |
| Example 3 | — | — | — | — | — | — | — | — | — | — | — |
| Example 4 | — | — | — | — | — | — | — | — | — | — | — |
| Example 5 | — | — | — | — | — | — | — | — | — | — | — |
| Example 6 | — | — | — | — | — | — | — | — | — | — | — |
| Example 7 | — | — | — | — | — | — | — | — | — | — | — |
| Example 8 | — | — | — | — | — | — | — | — | — | — | — |
| Example 9 | — | — | — | — | — | — | — | — | — | — | — |
| Example 10 | — | — | — | — | — | — | — | — | — | — | — |
| Example 11 | — | — | — | — | — | — | — | — | — | — | — |

TABLE 2

| | First wafer lens 52 | | | | | | | | | | | |
|---|---|---|---|---|---|---|---|---|---|---|---|---|
| | Second substrate 30 | Surface S3 Surface modification treatment | Water contact angle[°] | Adhesive layer | Diaphragm | Surface modification treatment | Water contact angle[°] | Adhesive layer 31 Lower layer | Upper layer | Removal of adhesive layer | Lens: resin layer 32 | State of bonding at interfaces |
| Example 1 | — | — | — | — | — | — | — | — | — | — | — | — |
| Example 2 | — | — | — | — | — | — | — | — | — | — | — | — |
| Example 3 | — | — | — | — | — | — | — | — | — | — | — | — |
| Example 4 | — | — | — | — | — | — | — | — | — | — | — | — |
| Example 5 | — | — | — | — | — | — | — | — | — | — | — | — |
| Example 6 | — | — | — | — | — | — | — | — | — | — | — | — |
| Example 7 | — | — | — | — | — | — | — | — | — | — | — | — |
| Example 8 | — | — | — | — | — | — | — | — | — | — | — | — |
| Example 9 | — | — | — | — | — | — | — | — | — | — | — | — |
| Example 10 | — | — | — | — | — | — | — | — | — | — | — | — |
| Example 11 | — | — | — | — | — | — | — | — | — | — | — | — |

| | Surface S4 Surface modification treatment | Water contact angle[°] | Adhesive layer 33 | Diaphragm 18c | Surface modification treatment | Water contact angle[°] | Adhesive layer 35 Lower layer | Upper layer | Removal of adhesive layer | Lens: resin layer 34 | State of bonding at interfaces | Provision of spacer | Number of lenses causing interlayer separation after dicing |
|---|---|---|---|---|---|---|---|---|---|---|---|---|---|
| Example 1 | — | — | — | — | — | — | — | — | — | — | — | — | 12 |
| Example 2 | — | — | — | — | — | — | — | — | — | — | — | — | 14 |
| Example 3 | — | — | — | — | — | — | — | — | — | — | — | — | 7 |
| Example 4 | — | — | — | — | — | — | — | — | — | — | — | — | 4 |
| Example 5 | — | — | — | — | — | — | — | — | — | — | — | — | 9 |
| Example 6 | — | — | — | — | — | — | — | — | — | — | — | — | 8 |
| Example 7 | — | — | — | — | — | — | — | — | — | — | — | — | 6 |
| Example 8 | — | — | — | — | — | — | — | — | — | — | — | Yes: surface S1 | 5 |
| Example 9 | — | — | — | — | — | — | — | — | — | — | — | — | 5 |
| Example 10 | — | — | — | — | — | — | — | — | — | — | — | — | 5 |
| Example 11 | — | — | — | — | — | — | — | — | — | — | — | — | 3 |

TABLE 3

| | First wafer lens 51 | | | | | | | | | | | |
|---|---|---|---|---|---|---|---|---|---|---|---|---|
| | First substrate 12 | Surface S1: topmost Surface modification treatment | Water contact angle[°] | Adhesive layer 14 | Diaphragm 18a | Surface modification treatment | Water contact angle[°] | Adhesive layer 15 Lower layer | Upper layer | Removal of adhesive layer | Lens: resin layer 16 | State of bonding at interfaces |
| Example 12 | ↑ | Oxygen plasma, 200 W, 2 min | 18 | — | ↑ | Oxygen plasma, 200 W, 2 min | 21 | ↑ | ↑ | ↑ | ↑ | ↑ |
| Example 13 | ↑ | Oxygen plasma, 200 W, 4 min | 10 | — | ↑ | Oxygen plasma, 200 W, 4 min | 14 | ↑ | ↑ | ↑ | ↑ | ↑ |
| Example 14 | ↑ | Oxygen plasma, 400 W, 6 min | 4 | — | Black filler + epoxy base | Oxygen plasma, 400 W, 6 min | 4 | ↑ | ↑ | ↑ | Epoxy base | ↑ |
| Example 15 | ↑ | — | 47 | — | ↑ | — | 49 | Acryl-based adhesive | — | — | Acryl base | Resin layer entirely bonded on entire surface of adhesive layer |
| Example 16 | ↑ | — | ↑ | — | ↑ | — | ↑ | SiO2 | Epoxy-based silane coupling agent | Acetone | Epoxy base | Resin layer bonded to adhesive layer and diaphragm |
| Example 17 | ↑ | Oxygen plasma, 200 W, 2 min | 18 | — | Black filler + acryl base | Oxygen plasma, 200 W, 2 min | 21 | TiO2 | Acryl-based silane coupling agent | Ethanol | Acryl base | ↑ |
| Example 18 | ↑ | ↑ | ↑ | ↑ | — | ↑ | ↑ | ↑ | ↑ | ↑ | ↑ | ↑ |
| Example 19 | ↑ | ↑ | ↑ | ↑ | — | ↑ | ↑ | ↑ | ↑ | ↑ | ↑ | ↑ |
| Comparative Example 1 | ↑ | — | ↑ 47 | — | Chromium oxide base | — | 54 | — | — | — | ↑ | — |
| Comparative Example 2 | ↑ | — | ↑ | — | Black filler + acryl base | — | 49 | — | — | — | ↑ | — |
| Comparative Example 3 | ↑ | — | ↑ | — | ↑ | — | ↑ | — | — | — | ↑ | — |

| | Surface S2 Surface modification treatment | Water contact angle[°] | Adhesive layer 20 | Diaphragm 18b | Surface modification treatment | Water contact angle[°] | Adhesive layer 21 Lower layer | Upper layer | Removal of adhesive layer | Lens: resin layer 22 | State of bonding at interfaces |
|---|---|---|---|---|---|---|---|---|---|---|---|---|
| Example 12 | — | — | — | — | — | — | — | — | — | — | — |
| Example 13 | — | — | — | — | — | — | — | — | — | — | — |
| Example 14 | — | — | — | — | — | — | — | — | — | — | — |
| Example 15 | — | 47 | — | Black filler + epoxy base | — | 49 | Acryl-based adhesive | — | — | Acryl base | Resin layer entirely bonded on entire surface of adhesive layer |
| Example 16 | — | ↑ | — | ↑ | — | ↑ | SiO2 | Epoxy-based silane coupling agent | Acetone | Epoxy base | Resin layer bonded to adhesive layer and diaphragm |
| Example 17 | Oxygen plasma, 200 W, 2 min | 18 | — | Black filler + acryl base | Oxygen plasma, 200 W, 2 min | 21 | TiO2 | Acryl-based silane coupling agent | Ethanol | Acryl base | ↑ |
| Example 18 | ↑ | ↑ | — | ↑ | ↑ | ↑ | ↑ | ↑ | ↑ | ↑ | ↑ |
| Example 19 | ↑ | ↑ | — | ↑ | ↑ | ↑ | ↑ | ↑ | ↑ | ↑ | ↑ |
| Comparative Example 1 | — | — | — | — | — | — | — | — | — | — | — |
| Comparative Example 2 | — | 47 | — | Black filler + acryl base | — | 49 | — | — | — | Acryl base | — |
| Comparative Example 3 | — | ↑ | — | ↑ | — | ↑ | — | — | — | ↑ | — |

TABLE 4

First wafer lens 52

| | Second substrate 30 | Surface S3 Surface modification treatment | Water contact angle[°] | Adhesive layer | Diaphragm | Surface modification treatment | Water contact angle[°] | Adhesive layer 31 Lower layer | Upper layer | Removal of adhesive layer | Lens: resin layer 32 | State of bonding at interfaces |
|---|---|---|---|---|---|---|---|---|---|---|---|---|
| Example 12 | — | — | — | — | — | — | — | — | — | — | — | — |
| Example 13 | — | — | — | — | — | — | — | — | — | — | — | — |
| Example 14 | — | — | — | — | — | — | — | — | — | — | — | — |
| Example 15 | — | — | — | — | — | — | — | — | — | — | — | — |
| Example 16 | — | — | — | — | — | — | — | — | — | — | — | — |
| Example 17 | — | — | — | — | — | — | — | — | — | — | — | — |
| Example 18 | Borosilicate glass | Oxygen plasma, 200 W, 2 min | 18 | — | Black filler + acryl base | Oxygen plasma, 200 W, 2 min | 21 | TiO2 | Acryl-based silane coupling agent- | Ethanol | Acryl base | Resin layer bonded to adhesive layer and diaphragm |
| Example 19 | ↑ | ↑ | ↑ | — | ↑ | ↑ | ↑ | ↑ | ↑ | ↑ | ↑ | ↑ |
| Comparative Example 1 | — | — | — | — | — | — | — | — | — | — | — | — |
| Comparative Example 2 | — | — | — | — | — | — | — | — | — | — | — | — |
| Comparative Example 3 | Borosilicate glass | — | 47 | — | Black filler + acryl base | — | 49 | — | — | — | Acryl base | — |

| | Surface S4 Surface modification treatment | Water contact angle[°] | Adhesive layer 33 | Diaphragm 18c | Surface modification treatment | Water contact angle[°] | Adhesive layer 35 Lower layer |
|---|---|---|---|---|---|---|---|
| Example 12 | — | — | — | — | — | — | — |
| Example 13 | — | — | — | — | — | — | — |
| Example 14 | — | — | — | — | — | — | — |
| Example 15 | — | — | — | — | — | — | — |
| Example 16 | — | — | — | — | — | — | — |
| Example 17 | — | — | — | — | — | — | — |
| Example 18 | Oxygen plasma, 200 W, 2 min | 18 | — | Black filler + acryl base | Oxygen plasma, 200 W, 2 min | 21 | TiO2 |
| Example 19 | ↑ | ↑ | ↑ | — | ↑ | ↑ | ↑ |
| Comparative Example 1 | — | — | — | — | — | — | — |
| Comparative Example 2 | — | — | — | — | — | — | — |
| Comparative Example 3 | — | 47 | — | Black filler + acryl base | — | 49 | — |

| | Upper layer | Removal of adhesive layer | Lens: resin layer 34 | State of bonding at interfaces | Provision of spacer | Number of lenses causing interlayer separation after dicing |
|---|---|---|---|---|---|---|
| Example 12 | — | — | — | — | — | 2 |
| Example 13 | — | — | — | — | — | 1 |
| Example 14 | — | — | — | — | — | 0 |
| Example 15 | — | — | — | — | — | 10 |
| Example 16 | — | — | — | — | — | 5 |
| Example 17 | — | — | — | — | Yes: surface S2 | 3 |
| Example 18 | Acryl-based silane coupling agent | Ethanol | Acryl base | Resin layer bonded to adhesive layer and stop | — | 2 |
| Example 19 | ↑ | ↑ | ↑ | ↑ | Yes: surface S4 | 2 |
| Comparative Example 1 | — | — | — | — | — | 47 |
| Comparative Example 2 | — | — | — | — | Yes: surface S2 | 54 |
| Comparative Example 3 | — | — | Acryl base | — | Yes: surfaces S1, S4 | 51 |

Note that, in Table 1 to Table 4, "—" represents absence of component, and "↑" represents that the component is the same with that in the preceding Example (Comparative Example) in the upper column.

In short, Examples 1 to 14, and Comparative Example 1 represent configurations having the lens portions formed only on one surface of the substrate, whereas Examples 15 to 19, and Comparative Examples 2 and 3 represent those having the lens portions formed on both surfaces of the substrate.

CONCLUSION

Tables 1 to 4 clearly teaches that Example 1 to Example 19, which are improved in the wettability of the surfaces of the lens, the surface and the diaphragms, by forming various adhesive layers between the substrate and the diaphragms, or by forming the adhesive layer after formation of the diaphragms, were found to give smaller numbers of lenses which showed interlayer separation after dicing, as compared with Comparative Examples 1 to 3. It is therefore known that the interlayer adhesiveness was improved, and the adhesiveness was desirable in all layers.

By virtue of the improved adhesiveness among the individual layers, also MTF characteristics and so forth of the singulated lenses obtained after dicing of the wafer lens are desirable.

What is claimed is:

1. An image capture lens, comprising:
   a diaphragm formed on a substrate and having a predetermined aperture for adjusting quantity of light;
   an inorganic or organic adhesive layer formed on the substrate so as to cover the diaphragm; and
   a resin component having a lens portion made of a curable resin, wherein
   the resin component is bonded directly to the inorganic or organic adhesive layer, and
   the diaphragm is composed of a resin which contains a black filler.

2. The image capture lens of claim 1, wherein the organic adhesive layer is a silane coupling agent layer.

3. The image capture lens of claim 1, wherein the lens portion is formed on both of object-side surface and image-side surface of the substrate.

4. The image capture lens of claim 1, wherein the inorganic or organic adhesive layer has a multi-layered configuration having an inorganic adhesive layer and an organic adhesive layer stacked in this order from a substrate side.

5. The image capture lens of claim 1, further comprising an organic adhesive layer provided between the substrate and the diaphragm.

6. An image capture lens, comprising;
   a diaphragm formed on a substrate and having a predetermined aperture for adjusting quantity of light;
   an inorganic or organic adhesive layer formed on the substrate so as to expose the diaphragm; and
   a resin component having a lens portion made of a curable resin, wherein the resin component is bonded directly to the inorganic or organic adhesive layer, and to the diaphragm.

7. The image capture lens of claim 6, wherein the substrate and the diaphragm are subjected to surface modification treatment.

8. A wafer lens, comprising:
   a plurality of diaphragms formed on a substrate, each having a predetermined aperture for adjusting quantity of light;
   an inorganic or organic adhesive layer formed on the substrate so as to cover the diaphragms; and
   a resin component having a plurality of lens portions made of a curable resin, wherein the resin component is bonded directly to the inorganic or organic adhesive layer, and
   the diaphragm are composed of a resin which contains a black filler.

9. The wafer lens of claim 8, wherein the organic adhesive layer is a silane coupling agent layer.

10. The wafer lens of claim 8, wherein the resin composing the diaphragms has a highly reactive group such as a hydroxyl group and a carboxyl group, and also the resin which contains the lens portions has a highly reactive group such as a hydroxyl group and a carboxyl group.

11. The wafer lens of claim 8, wherein the resin composing the diaphragms is epoxy, acryl or allyl ester resin, and also the resin which contains the lens portion is epoxy, acryl or allyl ester resin.

12. The wafer lens of claim 8, wherein the lens portions are formed on both of object-side surface and image-side surface of the substrate.

13. The wafer lens of claim 8, wherein the inorganic or organic adhesive layer has a multi-layered configuration having an inorganic adhesive layer and an organic adhesive layer stacked in this order from a substrate side.

14. The wafer lens of claim 8, further comprising an organic adhesive layer provided between the substrate and the diaphragms.

15. The wafer lens of claim 8, wherein the diaphragms are formed into an annular pattern so as to surround outer circumferences of the lens portions in the plan view.

16. A wafer lens, comprising;
   a plurality of diaphragms formed on a substrate, each having a predetermined aperture for adjusting quantity of light;
   an inorganic or organic adhesive layer formed on the substrate so as to expose the diaphragms; and
   a resin component having a plurality of lens portions made of a curable resin, wherein the resin component is bonded directly to the inorganic or organic adhesive layer, and to the diaphragms.

17. The wafer lens of claim 16, wherein the substrate and the diaphragms are subjected to surface modification treatment.

18. A wafer lens, comprising:
   a plurality of diaphragms formed on a substrate, each having a predetermined aperture for adjusting quantity of light;
   an inorganic or organic adhesive layer formed on the substrate so as to expose the diaphragms; and
   a resin component having a plurality of lens portions made of a curable resin, wherein
   the resin component is bonded directly to the inorganic or organic adhesive layer, and to the diaphragms, and
   a spacer having opening at positions corresponded to the plurality of lenses in the direction of optical axis thereof, is bonded to positions in a direction of optical axis corresponding to the plurality of lens portions.

19. The wafer lens of claim 18, wherein the lens portions are formed on both of object-side surface and image-side surface of the substrate, and the spacer is provided on the image-side surface of the substrate.

20. The wafer lens of claim 18, wherein the inorganic or organic adhesive layer has a multi-layered configuration having an inorganic adhesive layer and an organic adhesive layer stacked in this order from a substrate side.

21. The wafer lens of claim 18, further comprising an organic adhesive layer provided between the substrate and the diaphragms.

22. A wafer lens laminate configured by stacking a plurality of wafer lenses, wherein
at least one wafer lens out of the plurality of wafer lenses comprises:
a plurality of diaphragms formed on a substrate, each having a predetermined aperture for adjusting quantity of light;
an inorganic or organic adhesive layer formed on the substrate so as to expose the diaphragms; and
a resin component having a plurality of lens portions made of a curable resin, the resin component being bonded directly to the inorganic or organic adhesive layer, and to the diaphragms.

23. The wafer lens laminate of claim 22, wherein the inorganic or organic adhesive layer has a multi-layered configuration having an inorganic adhesive layer and an organic adhesive layer tacked in this order from a substrate side.

24. The wafer lens laminate of claim 22, further comprising an organic adhesive layer provided between the substrate and the diaphragms.

25. A method of manufacturing an image capture lens which has a resin component including a lens portion made of a curable resin, which resin component being formed on a substrate, the method comprising:
a diaphragm forming process for forming on the substrate, each of a plurality of diaphragms having a predetermined aperture for adjusting quantity of light;
an adhesive layer forming process following after the diaphragm forming process, for forming on the substrate having the diaphragms formed thereon, an inorganic or organic adhesive layer so as to cover the diaphragms;
a molding process following after the adhesive layer forming process, for forming the resin component by dropping the curable resin between the inorganic or organic adhesive layer and a molding die having a molding surface for forming a plurality of the lens portions, and by molding and curing the resin under pressurized die;
a dicing process following after the molding process, for dicing a work to singulate the plurality of the lens portions into a single lens portion; and
a surface modification process for performing a surface modification treatment so as to adjust wettability of the surface of the substrate and the surface of the diaphragms after the diaphragm forming process, in the range from 3° or larger and 30° or smaller in terms of water contact angle.

26. The method of manufacturing an image capture lens of claim 25, wherein the adhesive layer forming process is a process for forming a silane coupling agent layer.

27. The method of manufacturing an image capture lens of claim 25, wherein either UV ozone treatment or plasma treatment is performed in the surface modification process.

28. A method of manufacturing an image capture lens having a resin component which has a lens portion made of a curable resin, which resin component being formed on a substrate, the method comprising:
a diaphragm forming process for forming on the substrate, each a plurality of diaphragms having a predetermined aperture for adjusting quantity of light;
an adhesive layer forming process following after the diaphragm forming process, for forming on the substrate having the diaphragms formed thereon, an inorganic or organic adhesive layer so as to cover the diaphragms;
an adhesive layer removing process following after the adhesive layer forming process, for removing portions of the inorganic or organic adhesive layer formed on the diaphragms;
a molding process following after the adhesive layer removing process, for forming the resin component by dropping the curable resin between the inorganic or organic adhesive layer and a molding die having a molding surface for forming a plurality of the lens portions, and by molding and curing the resin under pressurized die; and
a dicing process following after the molding process, for dicing a work to thereby singulate the plurality of the lens portions into a single lens portion.

29. The method of manufacturing an image capture lens of claim 28, wherein the inorganic or organic adhesive layer in the adhesive removing process is removed using acetone or ethanol.

30. A method of manufacturing an image capture lens having a resin component which has a lens portion made of a curable resin and which resin component being formed on at least one surface of a substrate, the method comprising:
a diaphragm forming process for forming on at least one surface of the substrate, a plurality of diaphragms each having a predetermined aperture for adjusting quantity of light;
an adhesive layer forming process following after the diaphragm forming process, for forming on the substrate having the diaphragms formed thereon, an inorganic or organic adhesive layer so as to cover the diaphragms;
an adhesive layer removing process following after the adhesive layer forming process, for removing portions of the inorganic or organic adhesive layer formed on the diaphragms;
a molding process following after the adhesive layer removing process, for forming the resin component by dropping the curable resin between the inorganic or organic adhesive layer and a molding die having a molding surface for forming a plurality of the lens portions, and by molding and curing the resin under pressurized die;
a stacking process for forming a wafer lens laminate by stacking a plurality of the wafer lenses obtained by the molding process; and
a dicing process following after the stacking process, for dicing a work to singulate the plurality of the lens portions into a single lens portion.

31. An image capture lens intermediate product for fabricating an image capture lens, which has a resin component having a lens portion made of a curable resin, on a substrate, the intermediate product comprising a diaphragm formed on a substrate and having a predetermined aperture for adjusting quantity of light, wherein water contact angle on a surface of the diaphragm is in a range from 3° or larger and 30° or smaller.

32. The image capture lens intermediate product of claim 31, wherein the water contact angle on the surface of the diaphragm is 3° or larger and 20° or smaller.

33. A method of manufacturing an image capture lens intermediate product for fabricating an image capture lens, which has a resin component having a lens portion made of a curable resin, on a substrate, the method comprising: a diaphragm forming process for forming on at least one surface of the substrate, a diaphragm having a predetermined aperture for adjusting quantity of light; and a surface modification process for performing surface modification treatment with respect to at least one surface of the substrate having the diaphragm formed thereon, wherein in the surface modification process, the surface modification treatment is performed so as to adjust wettability of the surface of the diaphragm in a range from 3° or larger and 30° or smaller in terms of water contact angle.

34. The method of manufacturing the image capture lens intermediate product of claim 33, wherein in the surface modification process, the surface modification treatment is performed so as to adjust the wettability of the surface of the diaphragm in the range from 3° or larger and 20° or smaller in terms of the water contact angle.

\* \* \* \* \*